United States Patent
Alessandro et al.

(10) Patent No.: US 9,979,289 B2
(45) Date of Patent: May 22, 2018

(54) METHOD FOR DRIVING CONVERTERS, AND CORRESPONDING CONVERTER AND DEVICE

(71) Applicant: STMicroelectronics S.r.l., Agrate Brianza (IT)

(72) Inventors: Agatino Antonino Alessandro, Riposto (IT); Carmelo Alberto Santagati, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days. days.

(21) Appl. No.: 15/139,828

(22) Filed: Apr. 27, 2016

(65) Prior Publication Data

US 2017/0019094 A1 Jan. 19, 2017

(30) Foreign Application Priority Data

Jul. 16, 2015 (IT) .......................... 102015000034944

(51) Int. Cl.
*H02M 3/158* (2006.01)
*H02M 1/08* (2006.01)
*H03K 17/14* (2006.01)

(52) U.S. Cl.
CPC .............. *H02M 3/158* (2013.01); *H02M 1/08* (2013.01); *H03K 17/145* (2013.01); *H03K 2217/0081* (2013.01)

(58) Field of Classification Search
CPC ............ H02M 1/00; H02M 1/08; H02M 3/00; H02M 3/158; H03K 17/00; H03K 17/04126; H03K 17/063; H03K 17/0826; H03K 17/145; H03K 17/601; H03K 2217/00; H03K 2217/0036; H03K 2217/0081

USPC ......................................................... 327/109
See application file for complete search history.

(56) References Cited

U.S. PATENT DOCUMENTS

| 6,172,493 B1* | 1/2001 | Grant .................... H02M 7/538 323/224 |
| 8,558,586 B1* | 10/2013 | Martin .................. G11C 7/1057 327/108 |
| 2011/0018613 A1* | 1/2011 | Wang ................... H02M 3/1588 327/530 |

(Continued)

FOREIGN PATENT DOCUMENTS

WO WO-2014068354 A1 5/2014

OTHER PUBLICATIONS

Italian Search Report and Written Opinion for IT 102015000034944 dated Mar. 9, 2016 (7 pages).

*Primary Examiner* — Lincoln Donovan
*Assistant Examiner* — David Mattison
(74) *Attorney, Agent, or Firm* — Crowe & Dunlevy (57) ABSTRACT

A switching converter includes a first electronic switch and a second electronic switch and respective drive circuits for switching on and switching off alternatively the first and second electronic switches. The drive circuits have a supply line for supplying to them a supply voltage. At least one of the drive circuits has, coupled to it, a capacitor for storing the supply voltage. An electronic-switching circuit is provided for selectively disconnecting the drive circuit from the supply line when the electronic switch driven thereby is switched off. In this mode, the drive circuit is supplied by the voltage stored on the capacitor.

16 Claims, 5 Drawing Sheets

(56) References Cited

U.S. PATENT DOCUMENTS

2014/0266130 A1 9/2014 Chiang et al.
2016/0134279 A1* 5/2016 Sicard ................. H03K 17/687
  327/109

* cited by examiner

FIG. 5

METHOD FOR DRIVING CONVERTERS, AND CORRESPONDING CONVERTER AND DEVICE

PRIORITY CLAIM

This application claims priority from Italian Application for Patent No. 102015000034944 filed Jul. 16, 2015, the disclosure of which is incorporated by reference.

TECHNICAL FIELD

The present disclosure relates to switching converters. One or more embodiments may refer to power switching converters.

BACKGROUND

Owing to their efficiency, switching voltage regulators can be used in electronic systems for generating and distributing power supply to various circuits, for example integrated circuits, that make up the system itself.

Switching regulators tend to be noisy. Their operating principle envisages synchronized switching-on and switching-off of one or more power switches (sometimes referred to for short as "powers"). This entails dedicating attention in the design stage, for example, to the assembly board, in order to reduce the parasitic components (for example, inductances and resistances) that might condition the performance of the converter with a negative effect on operation thereof.

Also the package containing the regulator may be provided so as to present characteristics of low electrical noise (mutual and coupled inductances between the various pins, low resistance of the pins, etc.).

A particularly critical situation emerges when the power switches of the regulator are integrated. In this situation, the contribution of the package tends to add to that of the board, with increasingly critical operating conditions as the current intensity supplied by the regulator increases (for example, is higher than 1, 2, or 3 A).

Various implementations consequently aim at reducing the parasitic elements as the regulation current increases.

SUMMARY

A converter functions in the presence of non-negligible parasitic components and with high regulation currents.

In an embodiment, relating to a switching converter including a first electronic switch and a second electronic switch switched on and off alternatively via respective drive circuits supplied with a supply voltage over a supply line, a method includes: storing said supply voltage on a capacitor coupled with at least one of said respective drive circuits, and disconnecting said at least one of said respective drive circuits from said supply line when one of the first and second electronic switches driven by said at least one of said respective drive circuits is switched off, so that said at least one of said respective drive circuits is supplied with the voltage stored on said capacitor.

In an embodiment, a switching converter comprises: a first electronic switch and a second electronic switch, respective drive circuits for switching said first and second electronic switches on and off alternatively, each of said respective drive circuits having a supply line for supplying thereto a supply voltage, a capacitor coupled with at least one of said respective drive circuits for storing said supply voltage, and an electronic switching circuit configured to disconnect said at least one of said respective drive circuits from said supply line when the electronic switch driven by said at least one of said respective drive circuits is switched off so that said at least one of said respective drive circuits is supplied with the voltage stored on said capacitor.

In an embodiment, a switching converter comprises: a high-side switch; a low-side switch coupled in series with the high-side switch; a high-side drive circuit having an output coupled to a control terminal of the high-side switch, said high-side drive circuit having a first power supply node and a second power supply node; a capacitor coupled between the first power supply node and the second power supply node; and an electronic switching circuit configured to selectively connect a supply voltage to the first power supply node in response to control signals for controlling operation of the high-side and low-side switches, said electronic switching circuit disconnecting the supply voltage from the first power supply node when said control signals deactuate the high-side switch and actuate the low-side switch.

In an embodiment, a switching converter comprises: a high-side switch; a low-side switch coupled in series with the high-side switch; a low-side drive circuit having an output coupled to a control terminal of the low-side switch, said low-side drive circuit having a first power supply node and a second power supply node; a capacitor coupled between the first power supply node and the second power supply node; and an electronic switching circuit configured to selectively connect a supply voltage to the first power supply node in response to control signals for controlling operation of the high-side and low-side switches, said electronic switching circuit disconnecting the supply voltage from the first power supply node when said control signals deactuate the low-side switch and actuate the high-side switch.

One or more embodiments may also regard a corresponding converter as well as an electronic device comprising such a converter.

BRIEF DESCRIPTION OF THE DRAWINGS

One or more embodiments will be now described, purely by way of non-limiting example, with reference to the annexed figures, in which.

DETAILED DESCRIPTION

Illustrated in the ensuing description are various specific details aimed at providing an in-depth understanding of examples of embodiments. One or more embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like, that may be present in various points of this description do not necessarily refer to one and the same embodiment. Furthermore, particular conformations, structures, or characteristics may be combined in any adequate way in one or more embodiments.

The references used herein are only provided for convenience and hence do not define the sphere of protection or the scope of the embodiments.

In the figures, the reference number 10 designates as a whole a voltage converter (regulator) of the switching type.

The figures refer, by way of example, to a converter of a step-down type with a buck architecture. It will be appreciated, on the other hand, that the embodiments are not limited to this specific configuration and architecture. For example, as will be seen in what follows, FIG. 5 exemplifies the possibility of applying one or more embodiments to a converter configuration with bootstrap function on the high side.

Figure 1:
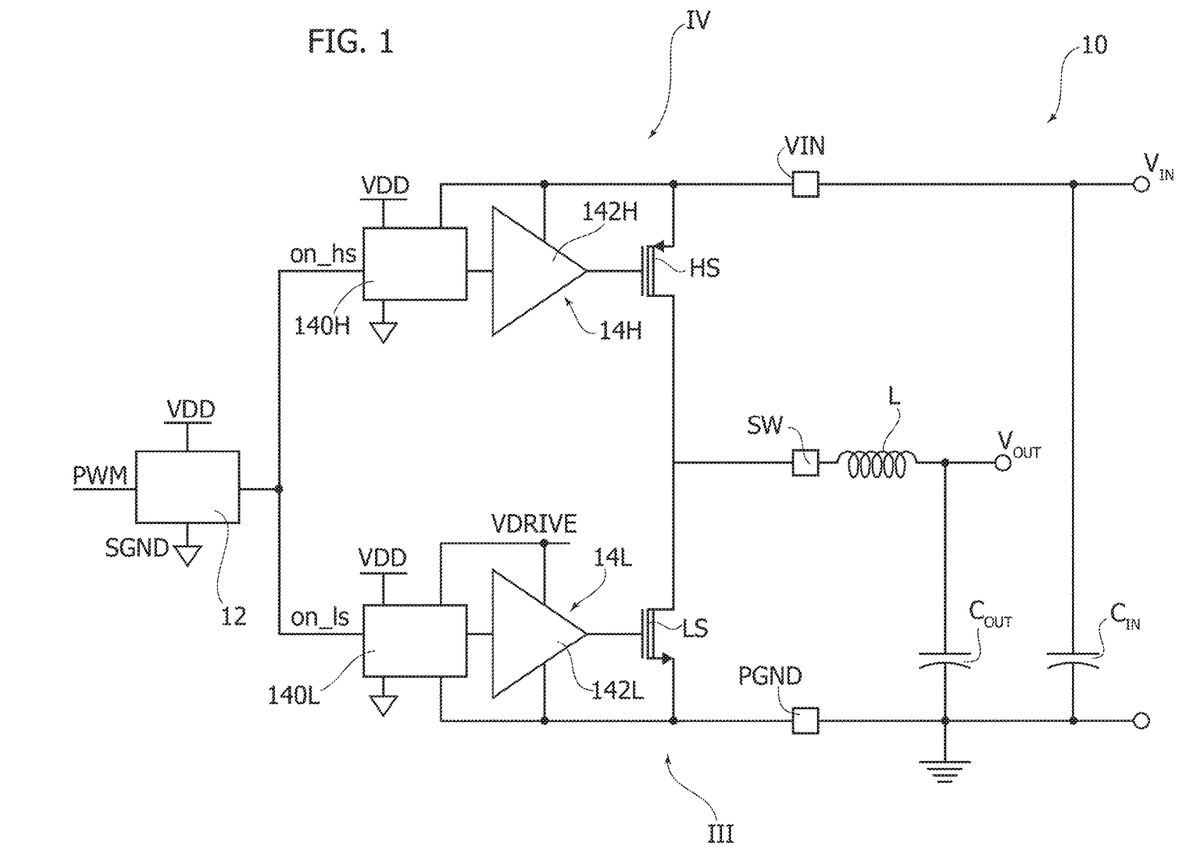
FIG. 1 is a block diagram of a converter of a switching type.

In its basic terms, and according to criteria in themselves known, the converter 10 illustrated in FIG. 1 comprises two electronic switches (for example MOSFETs), a high-side one (for example, of a P type) and a low-side one (for example, of an N type), designed to be switched on and off (i.e., rendered conductive and non-conductive) alternatively, as a function of a driving signal for example, of a PWM (Pulse-Width Modulation) type, supplied to a control module 12.

For example, the module 12 can generate respective driving signals on_hs and on_ls, which, through respective drive circuits 14H and 14L, can act on the control electrode (for example, the gate) of the respective electronic switch HS, LS.

The drive circuits 14H and 14L may include, for example, a level shifter 140H, 140L with cascaded thereto a matching stage 142H, 142L (for example, an operational amplifier with impedance-translator function) that acts on the control electrode of the respective switch HS, LS. The two switches HS, LS can thus be switched on and off alternatively with a duty cycle that varies according to the regulation function driven by the signal PWM.

In the examples presented in the figures, the two switches HS and LS are cascaded to one another (series connected in their source-drain paths) between a supply terminal VIN to which a voltage $V_{IN}$ is applied and a ground terminal PGND, whereas the intermediate point between the two switches HS, LS (for example, the connection between the two drains) may come under an output terminal SW. The terminal SW is designed to drive an output LC filter comprising an inductor L and an output capacitor $C_{OUT}$ so as to supply on the output terminal of the LC filter (intermediate point between the inductor L and the capacitor $C_{OUT}$) an output voltage $V_{OUT}$ substantially corresponding to the mean (average) component of the signal proposed, thus obtaining the desired regulation.

The reference $C_{IN}$ designates a capacitor that acts between the terminal VIN and ground for filtering the disturbance that may present on the supply voltage $V_{IN}$.

It will be appreciated on the other hand that the connection arrangement (for example, the polarity of the switches HS and LS) could be different from the one exemplified herein.

It is moreover to be taken into account that the general scheme of FIG. 1, as well as the corresponding operating criteria, are to be deemed in themselves known and hence such as not to require any detailed description herein.

As will be described more fully in what follows, one or more embodiments point in fact at intervening on parts of the above general scheme (for example, on the parts of circuit denoted by III and IV in FIG. 1) to take into account and counter the possible effect of parasitic components.

In operation of a converter as exemplified in FIG. 1—i.e., in general, a switching converter 10 comprising a first electronic switch HS and a second electronic switch LS switched on and off alternatively, in which the first electronic switch HS and the second electronic switch LS have respective drive circuits 14H, 14L supplied with a supply voltage VIN, VDRIVE provided over a supply line—the fact of preventing the two switches HS, LS from being simultaneously on (i.e., in conduction) assumes importance: this condition may in fact penalize the efficiency of the converter and induce damage thereto.

The driving signals on_hs and on_ls can be generated according to the signal PWM (for example, as a function of the duty cycle chosen for the regulation) in such a way as to give rise to a separation interval time (the so-called "disoverlap") designed to take into account the times necessary for effective switching-off of the two switches HS, LS so as to prevent one of the switches from being activated (i.e., sent into conduction) when the other is not yet completely off (i.e., is still partially conductive).

For generation of the aforesaid disoverlap, it is possible to resort to a simple delay or else adopt more sophisticated adaptive techniques, at the same time taking into account the fact that the disoverlap times can affect the overall efficiency and performance of the converter and also noting that, in various cases, the application of such a disoverlap may not be sufficient in the presence of parasitic components (especially of an inductive nature) of a certain degree and/or when the currents involved reach high intensities.

Figure 2:
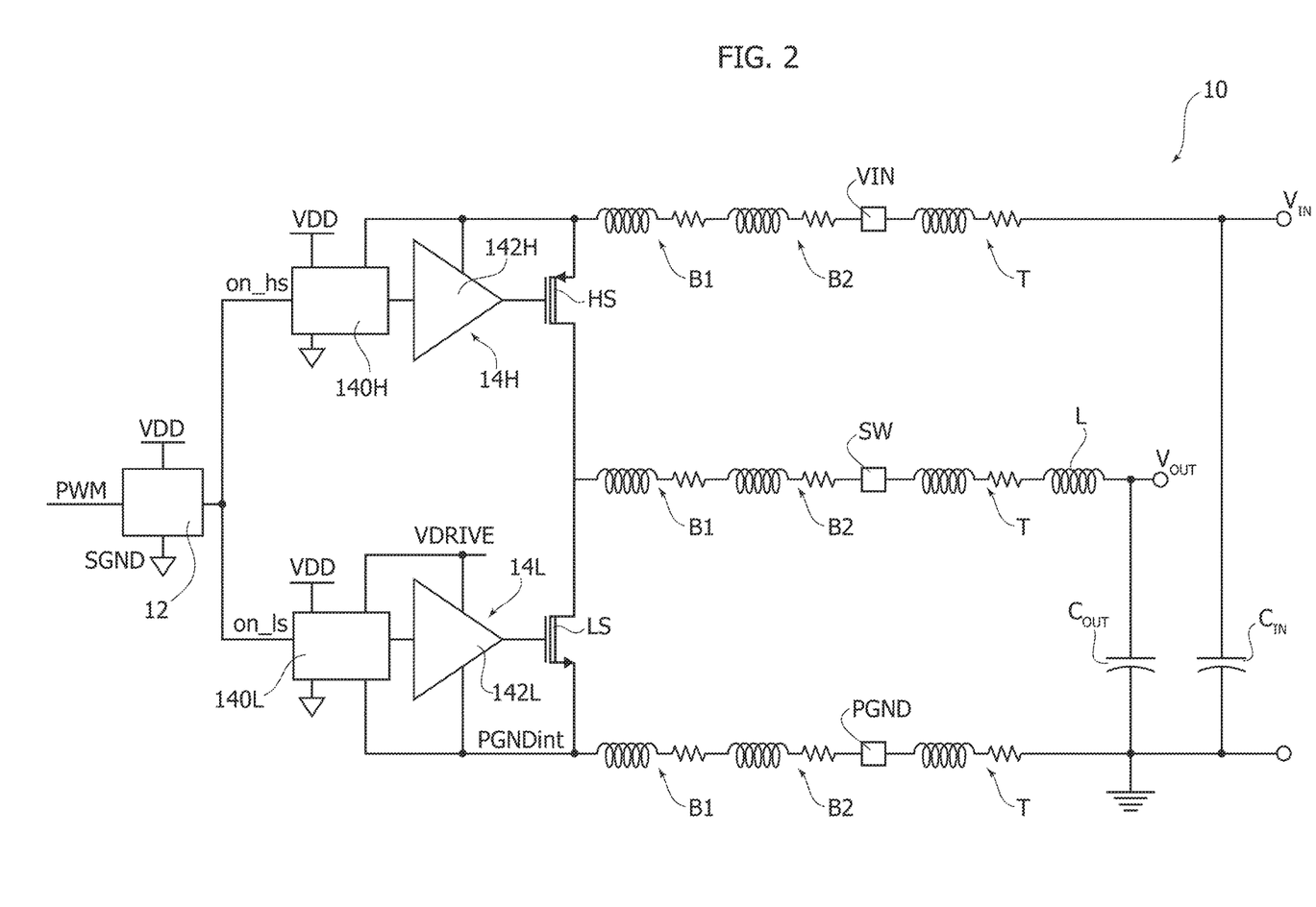
FIG. 2 highlights the possible presence of parasitic components in an electrical diagram like the one represented in FIG. 1.

The diagram of FIG. 2 reproduces the electrical diagram of FIG. 1 highlighting the possible presence of parasitic components of an inductive and resistive nature (represented in the diagram of FIG. 2 by the connection in series of an inductor and of a resistor) respectively at the level of the bonding wires B1 of the circuit, at the level of the leads B2 of the package of the circuit (the aforesaid parasitic elements B1 and B2 being substantially internal to the converter circuit, a fact highlighted with the representation with respect to the terminals VIN, SW, and PGND), and again at the level of the conductive lines (paths or tracks) T of the board on which the converter 10 is mounted.

The aforesaid parasitic components B1, B2, and T (above all those of an inductive nature) may be such as to generate oscillations at each transition of the converter (both at the level of switching-off and at the level of switching-on of the switches HS, LS) so as to affect the voltages present in the circuit (for example, the voltages present on the silicon in the case of an integrated circuit).

By way of example, considering the transition in which the low-side switch LS is switched off (i.e., rendered non-conductive) in order to switch on (i.e., render conductive) the high-side switch HS, the current through the ground terminal or contact PGND may be interrupted and start to flow through the terminal or contact VIN. Sudden interruption of a current that flows through an inductance (in this case the parasitic inductances comprised in the ground path coming under the terminal PGND) is such as to produce an overshoot across the inductance. These overshoots may present an amplitude such as to squeeze the voltage applied to the drive stage 14L of the switch LS, causing a sort of reset and a possible undesirable switching back on (return into conduction) of the switch LS itself.

The aforesaid oscillations are proportional to the value of the parasitic inductance present in the current path and to the value of the current subjected to switching. This makes it possible to appreciate the importance of these problems in the case of converters designed to supply high-intensity currents (for example, 5-7 A) and/or ones having packages that are not suited to being further scaled in terms of parasitic parameters.

Figure 3:
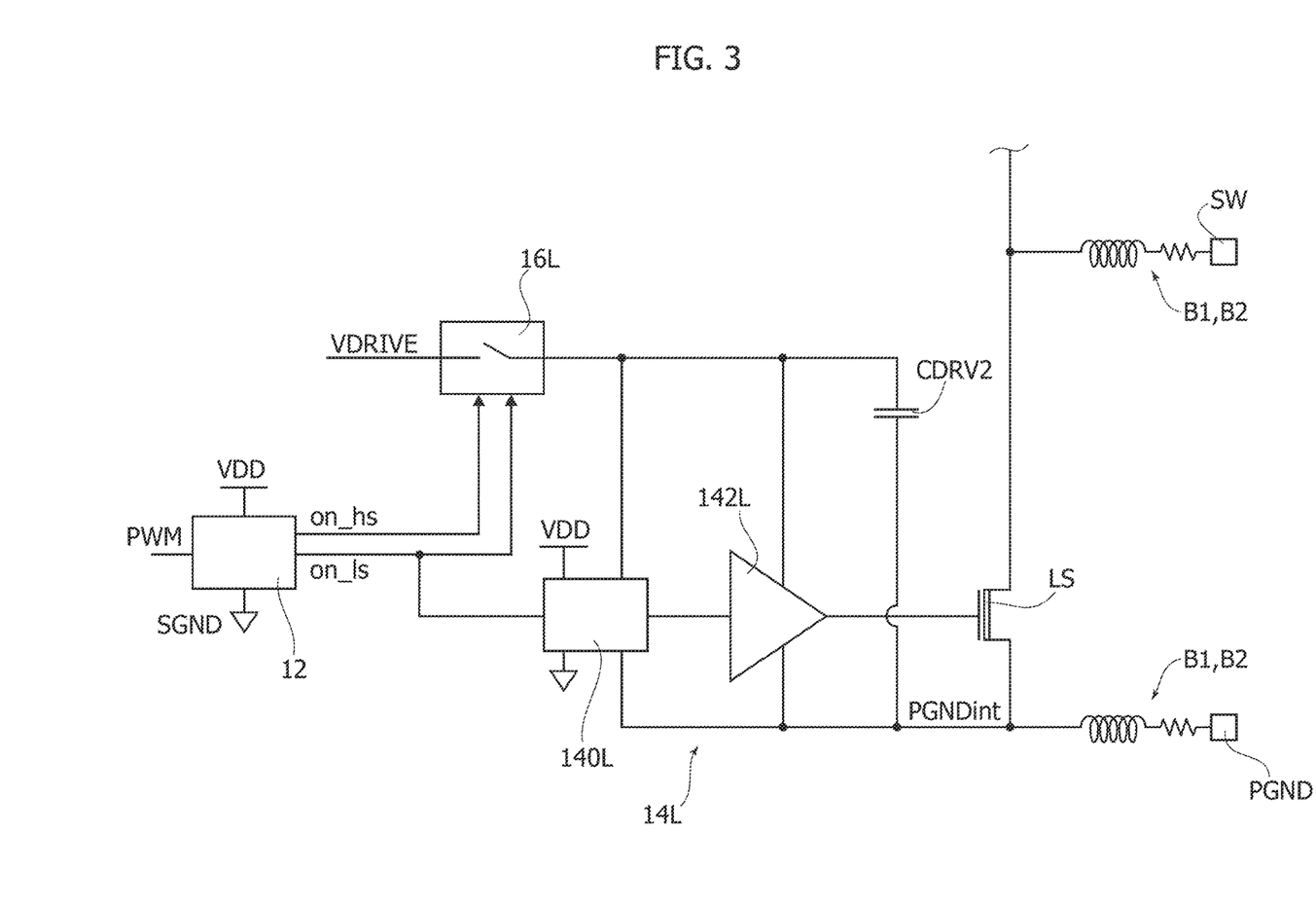
FIG. 3 exemplifies the possibility of intervening, according to one or more embodiments, on the portion of the circuit designated by III in FIG. 1.
Figure 4:
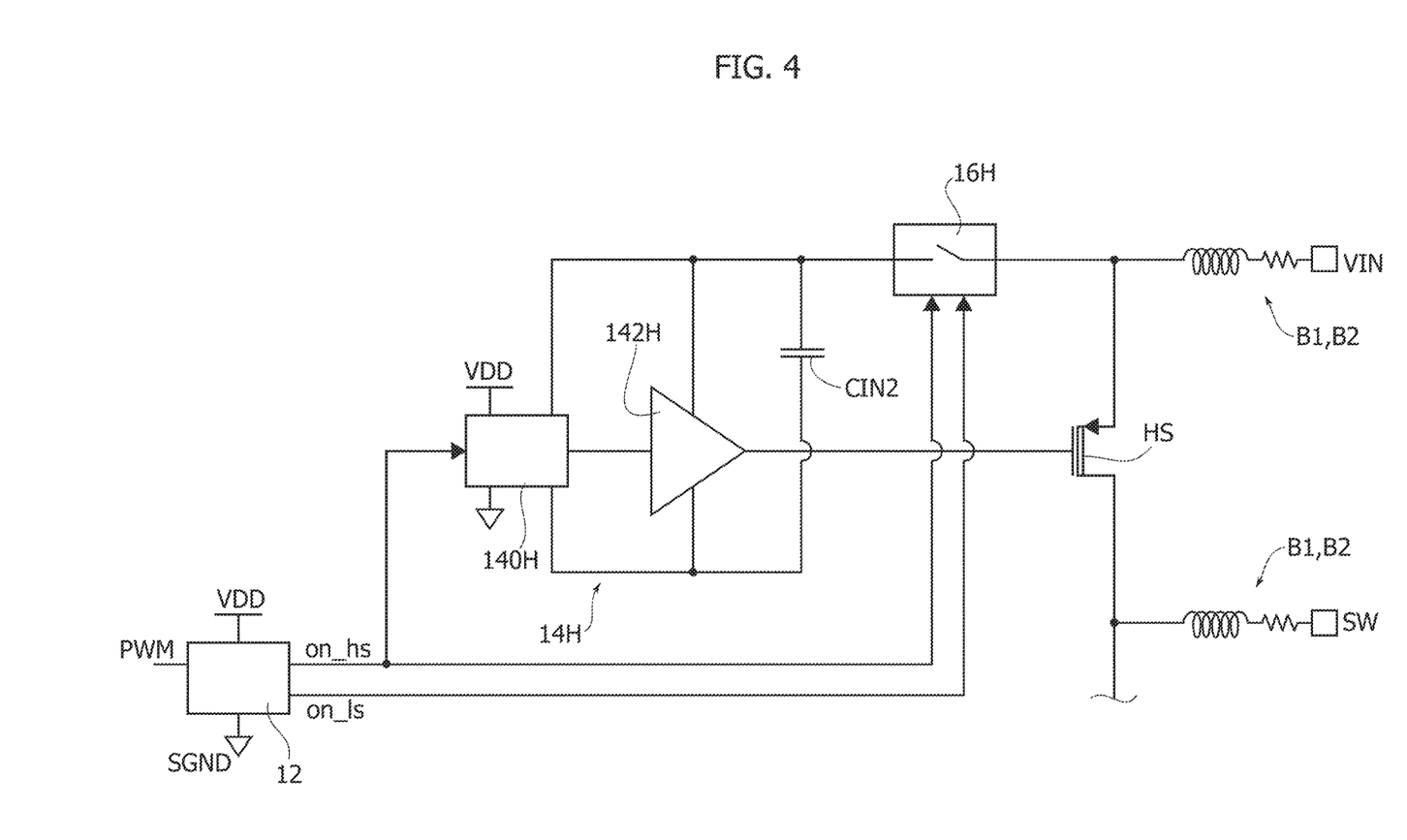
FIG. 4 exemplifies the possibility of intervening, according to one or more embodiments, on the portion of the circuit designated by IV in FIG. 1, and FIG. 5 exemplifies the possibility of applying one or more embodiments to a converter configuration with a bootstrap function.

In order to tackle the above problems:
one or more embodiments may resort to the solution exemplified in FIG. 3 with reference to the low-side switch LS;
one or more embodiments may resort to the solution exemplified in FIG. 4 with reference to the high-side switch HS; and
one or more embodiments may resort in a combined way to the solution exemplified in FIG. 3—with reference to the low-side switch LS—and to the solution exemplified in FIG. 4—with reference to the high-side switch HS.

FIG. 3 corresponds to the portion of FIG. 1 designated by III and highlights possible modifications of the scheme of FIG. 1 that can be implemented according to one or more embodiments.

For this reason, parts or elements that are identical or correspond to parts and elements already represented in FIG. 1 or FIG. 2 are designated in FIG. 3 by the same reference numbers, so that the corresponding description will not be repeated for brevity. In particular, in the diagram of FIG. 3, the references B1, B2 designate as a whole the inductive-resistive parasitic components present on the ground line PGND and on SW at the level of bonding wires (B1) and at the level of leads (B2).

One or more embodiments aim at preventing the stage for driving the switch (the switch LS, in the example of FIG. 3) from losing control, thus causing the latter to be supplied.

In one or more embodiments, the presence of a module 16L may be envisaged, which receives the voltage VDRIVE that supplies the drive stage 14L transferring this pre-regulated voltage onto a capacitor designated by CDRV2 so as to store capacitively this voltage on the capacitor.

In one or more embodiments, the capacitor CDRV2 may be integrated in such a way that the voltage VDRIVE2 can move like the level PGNDint.

In one or more embodiments, the module 16L (which may also be configured as an electronic switch designed to transfer the voltage VDRIVE across the capacitor CDRV2 and the drive circuit) may be sensitive to the driving signals on_hs and on_ls.

In this way, (shortly) before driving, as a function of the signal PWM, for example, the transition that leads to switching-off of the switch LS and then switching-on of the switch HS, the switch 16L can disconnect the drive stage 14L from the supply line on which the voltage VDRIVE is supplied, thus enabling the possible drawbacks outlined previously, i.e., the phenomenon of squeezing of the driving voltage, to be prevented.

In these conditions, the voltage applied to the stage 14L corresponds to the voltage stored capacitively on the capacitor CDRV2 referenced to the voltage PGNDint on the line coming under the ground terminal PGND (more precisely, if the presence of the parasitic components is taken into account, the voltage on the source of the switch LS), with this voltage applied maintained by the charged capacitance CDRV2 until the next switching.

As already mentioned, in one or more embodiments, the same solution is suited to being adopted, in addition or as an alternative, on the drive stage 14H for the high-side switch HS.

FIG. 4 corresponds to the portion of FIG. 1 designated by IV and highlights corresponding possible modifications of the diagram of FIG. 1 that can be implemented according to one or more embodiments.

The diagram reproduced in FIG. 4 is substantially similar to that of FIG. 3 if we note that, in the case of operation on the high side, instead of the low-side switch LS, the high-side switch HS will be present (for example, a MOSFET of a P type), with the terminals VIN and SW designed to perform a role substantially similar to the role performed by the terminals SW and PGND in the diagram of FIG. 3.

A capacitor CIN2 is moreover present, which plays a role similar to the one described previously with reference to the capacitor CDRV2 in co-operation with a module 16H, which in turn plays a role similar to what has been described previously for the module 16L with reference to a supply line coming under VIN instead of VDRIVE.

In the case of acting (also) on the high side, the transition such as to lead to disconnection of the drive circuit 14H from the supply line on which the voltage VIN is supplied may be the transition that leads to switching-off of the switch HS and then switching-on of the switch LS.

For completeness of illustration, the diagram of FIG. 5, where parts and/or components that are identical or similar to parts and/or components already described with reference to the other figures are designated by the same symbols, exemplifies another possible configuration of buck converter with the presence of a bootstrap function on the high side.

In this case, between a drive terminal VDRIVE_H (designed to receive a signal VDRIVE_H_int) and a bootstrap terminal BOOT a bootstrap diode BD may be present, with a bootstrap capacitor CBOOT set between the bootstrap terminal BOOT and the terminal SW. In this case, the switch HS may be a MOSFET of an N type with supply on the bootstrap node BOOT coming under the module 16H. The bootstrap diode BD may be integrated, and on the terminal VDRIVE_H a filter capacitance CVDRV H may be present.

Figure 5:
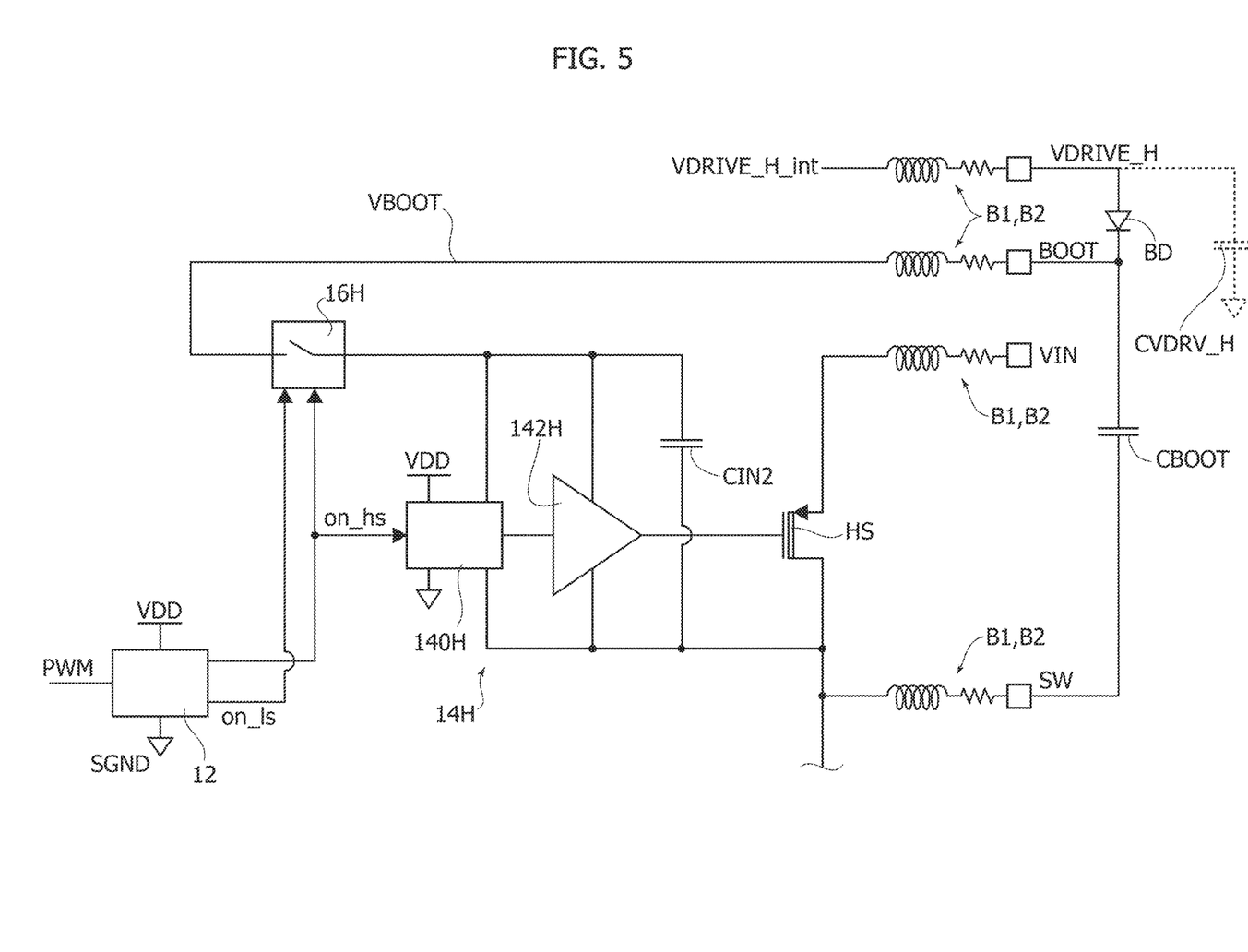

In embodiments such as the one exemplified in FIG. 5, the module 16H and the capacitor CIN2 may perform a role similar to that of the module 16L (with reference to a supply line driven by the bootstrap voltage VBOOT instead of VDRIVE) and of the capacitor CDRV2 used for the low side.

Of course, without prejudice to the underlying principles, the details of construction and the embodiments may vary, even significantly, with respect to what is illustrated herein purely by way of non-limiting example, without thereby departing from the extent of protection, which is defined by the annexed claims.

The invention claimed is:
1. A method of driving a switching converter including a high-side electronic switch switched on and off via a high-side drive circuit having a first power supply node and a second power supply node, the switching converter supplied with a supply voltage over a supply line, the method including:

in response to a transition of a high-side drive control signal that causes switching on of the high-side electronic switch, connecting said supply line to a first capacitor having a first terminal directly connected to the first power supply node and a second terminal directly connected to the second power supply node to store the supply voltage on the first capacitor, and in response to a transition of the high-side drive control signal that causes switching off of the high-side electronic switch, disconnecting said first power supply node of said high-side drive circuit and the first terminal of said first capacitor from said supply line, and supplying power to the first power supply node of said high-side drive circuit from the supply voltage stored on said first capacitor while the high-side electronic switch is switched off.

2. A switching converter, comprising:
a high-side switch coupled to a high-side supply line;
a low-side switch coupled in series with the high-side switch;
a high-side drive circuit having an output coupled to a control terminal of the high-side switch, said high-side drive circuit having a first power supply node and a second power supply node;
a first capacitor having a first terminal directly connected to the first power supply node and a second terminal directly connected to the second power supply node; and
an electronic switching circuit configured to selectively connect said high-side supply line to the first power supply node of the high-side drive circuit and the first terminal of said first capacitor in response to a transition of a control signal that causes switching on of the high-side switch, said electronic switching circuit further configured to disconnect the high-side supply line from the first power supply node of the high-side drive circuit and the first terminal of said first capacitor in response to a transition of a control signal that causes switching off of the high-side switch,
wherein the high-side drive circuit is supplied with a supply voltage stored on said first capacitor while the high-side electronic switch is switched off.

3. The switching converter of claim 2, further comprising:
a low-side drive circuit having an output coupled to a control terminal of the low-side switch, said low-side drive circuit having a third power supply node and a fourth power supply node;
a second capacitor having a first terminal directly connected to the third power supply node and having a second terminal directly connected to the fourth power supply node; and
a second electronic switching circuit configured to selectively connect a drive line to the first power supply node in response to a transition of a control signal that causes switching on of the low-side switch, said second electronic switching circuit further configured to disconnect the drive line from the first power supply node of the low-side drive circuit and the first terminal of said second capacitor in response to a transition of a control signal that causes switching off of the low-side switch,
wherein the low-side drive circuit is supplied with a supply voltage stored on said first capacitor while the low-side electronic switch is switched off.

4. The switching converter of claim 2, wherein the high-side switch and the low-side switch are turned on and off alternately.

5. The switching converter of claim 2, wherein the series connected high-side switch and low-side switch have an output terminal therebetween that is configured to drive an LC network providing a regulated voltage.

6. The switching converter of claim 2, wherein the high-side switch and low-side switch are each a solid state MOSFET switch.

7. A switching converter, comprising:
a high-side electronic switch coupled to a supply line receiving a supply voltage;
a high-side drive circuit having an output coupled to control switching of said high-side electronic switch, said high-side drive circuit having a first power supply node and a second power supply node;
a first capacitor having a first terminal directly connected to the first power supply node and a second terminal directly connected to the second power node; and
a first electronic switching circuit configured to connect the first power supply node to the supply line for storing the supply voltage on said first capacitor in response to a transition of a control signal that causes switching on of the high-side switch and further configured to disconnect the first power supply node from the supply line in response to a transition of a control signal that causes switching off of the high side switch,
wherein said high-side drive circuit is supplied with said supply voltage from said first capacitor while the high-side electronic switch is switched off.

8. The switching converter of claim 7, further including:
a low-side electronic switch coupled in series with said high-side electronic switch between said first supply line and a ground terminal;
a low-side drive circuit having an output coupled to control switching of said low-side electronic switch, said low-side drive circuit having a third power supply node and a fourth power supply node;
a second capacitor having a first terminal directly connected to the first power supply node and a second terminal directly connected to the fourth power node;
a second electronic switching circuit configured to connect a drive voltage from a drive line to the third supply node for storing the drive voltage on said second capacitor in response to a transition of a control signal that causes switching on of the low-side switch and further configured to disconnect the drive line from the third supply node in response to a transition of a control signal that causes switching off of the low-side switch,
wherein said low-side drive circuit is supplied with said drive voltage from said second capacitor while the high-side electronic switch is switched off.

9. The switching converter of claim 8, wherein the high-side electronic switch and the low-side electronic switch are turned on and off alternately.

10. The switching converter of claim 8, wherein the series connected high-side and low-side electronic switches have an output terminal therebetween configured to drive an LC network providing a regulated voltage.

11. The switching converter of claim 8, wherein the first and second electronic switches each comprise a solid state MOSFET switch.

12. A switching converter, comprising:
a high-side electronic switch having a first conduction terminal coupled to a first supply line receiving a first supply voltage and a second conduction terminal coupled to an output node;
a high-side drive circuit having an output coupled to control switching of said high-side electronic switch, said high-side drive circuit having a first power supply node and a second power supply node;

a first capacitor having a first terminal directly connected to the first power supply node and a second terminal directly connected to the second power supply node;

a second capacitor having a first terminal coupled to a second supply line receiving a second supply voltage different from the first supply voltage and a second terminal coupled to said output node; and a first electronic switching circuit configured to connect the second supply line to the first power supply node for storing the second supply voltage on said first capacitor in response to a transition of a control signal that causes switching on of the high-side switch and further configured to disconnect the first power supply node from the second supply line in response to a transition of a control signal that causes switching off of the high-side switch, wherein said high-side drive circuit is supplied with said second supply voltage from said first capacitor while the high-side electronic switch is switched off.

13. The switching converter of claim 12, further including a low-side electronic switch coupled between said output node and a ground terminal.

14. The switching converter of claim 13, wherein the high-side electronic switch and the low-side electronic switch are turned on and off alternately.

15. The switching converter of claim 13, further including:

a low-side drive circuit having an output coupled to control switching of said low-side electronic switch, said low-side drive circuit having a third power supply node and a fourth power supply node;

a third capacitor having a first terminal directly connected to the third power supply node and a second terminal directly connected to the fourth power supply node; and a second electronic switching circuit configured to connect a drive line to the third power supply node for storing a drive voltage on the third capacitor in response to a transition of a control signal that causes switching on of the high-side switch and further configured to disconnect the third power supply node from the drive line in response to a transition of a control signal that causes switching off of the high-side switch, wherein said low-side drive circuit is supplied with the drive voltage stored on said third capacitor.

16. The method of claim 1, wherein the switching converter further includes a low-side electronic switch switched on and off via a low-side drive circuit having a third power supply node and a fourth power supply node, the switching converter further supplied with a drive voltage over a drive line, the method further comprising:

in response to a transition of a control signal that causes switching on of the low-side switch, connecting said drive line to a second capacitor having a first terminal directly connected to the third power supply node and a second terminal directly connected to the fourth power supply node to store the drive voltage on the second capacitor;

in response to a transition of a control signal that causes switching off of the low-side switch, disconnecting the third power supply node of the low-side drive circuit and the first terminal of the second capacitor from said drive line, wherein said low-side drive circuit is supplied with the drive voltage stored on said second capacitor.

* * * * *